United States Patent
Ichino et al.

(10) Patent No.: US 6,879,607 B2
(45) Date of Patent: Apr. 12, 2005

(54) SEMICONDUCTOR LASER MODULE

(75) Inventors: Moriyasu Ichino, Kanagawa (JP); Shigeo Hayashi, Kanagawa (JP); Mitsuaki Nishie, Yokohama (JP)

(73) Assignees: Sumitomo Electric Industries, Ltd., Osaka (JP); NTT Electronics Corporation, Tokyo (JP)

(*) Notice: Subject to any disclaimer, the term of this patent is extended or adjusted under 35 U.S.C. 154(b) by 268 days.

(21) Appl. No.: 10/203,099

(22) PCT Filed: Dec. 6, 2001

(86) PCT No.: PCT/JP01/10678
§ 371 (c)(1),
(2), (4) Date: Aug. 6, 2002

(87) PCT Pub. No.: WO02/47220
PCT Pub. Date: Jun. 13, 2002

(65) Prior Publication Data
US 2003/0039290 A1 Feb. 27, 2003

(30) Foreign Application Priority Data

Dec. 6, 2000 (JP) .......................................... 2000-371618
Dec. 3, 2001 (JP) .......................................... 2001-368927

(51) Int. Cl.[7] .............................. H01S 3/00; H01S 3/04
(52) U.S. Cl. ............................. 372/34; 372/33; 372/36
(58) Field of Search ..................................... 372/32–36

(56) References Cited

U.S. PATENT DOCUMENTS

| | | | |
|---|---|---|---|
| 4,884,279 A | * 11/1989 | Odagiri | 372/29.021 |
| 6,097,743 A | * 8/2000 | Alphonse | 372/32 |
| 6,212,210 B1 | * 4/2001 | Serizawa | 372/32 |
| 6,291,813 B1 | * 9/2001 | Ackerman et al. | 250/214 R |
| 6,501,774 B2 | * 12/2002 | Kuwahara et al. | 372/32 |
| 6,556,345 B1 | * 4/2003 | Gassner et al. | 359/341.4 |

FOREIGN PATENT DOCUMENTS

| | | |
|---|---|---|
| EP | 0 762 568 | 3/1997 |
| JP | 2-148780 | 6/1990 |
| JP | 7-170005 | 7/1995 |
| JP | 7-248701 | 9/1995 |
| JP | 10-284791 | 10/1998 |

* cited by examiner

Primary Examiner—Minsun Oh Harvey
Assistant Examiner—Phillip Nguyen
(74) Attorney, Agent, or Firm—Smith, Gambrell & Russell, LLP

(57) ABSTRACT

A problem of the present invention is to provide a semiconductor laser module for making precise temperature control possible.

A semiconductor laser module 1 according to the present invention has a Peltier element 4, a thermistor 5 for detecting the temperature of the Peltier element 4, and a differential amplification circuit 6 for generating a control signal according to the detection signal from the thermistor 5 so that the surface temperature of the Peltier element 4 conforms to a set temperature. A parallel compensating circuit 12 for generating a compensating signal for compensating for a delay in temperature variation in the Peltier element 4 with respect to the input of current signal to the Peltier element 4 branches and is connected to the output portion of the differential amplification circuit 6. The compensating signal is sent to an addition circuit 9 and detection correction signal obtained by adding the detection signal of the thermistor 5 and the compensating signal is generated. The detection correction signal is sent to the differential amplification circuit 6 and a control signal corresponding to the difference between the detection correction signal and a signal corresponding to set temperature is generated.

4 Claims, 5 Drawing Sheets

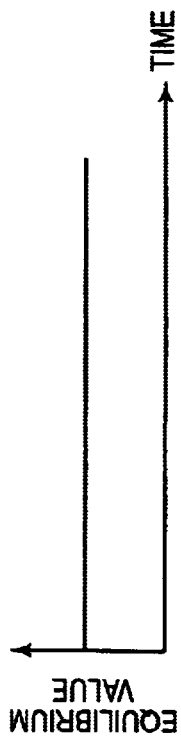
FIG. 3 (a) SET TEMPERATURE To
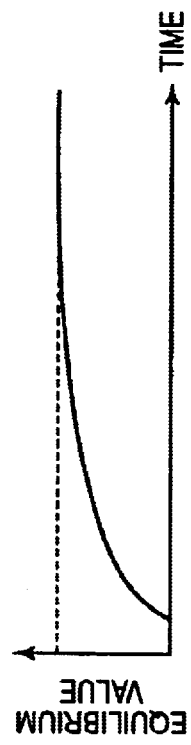
FIG. 3 (b) OUTPUT VALUE (DETECTION SIGNAL) OF BIAS CIRCUIT 7
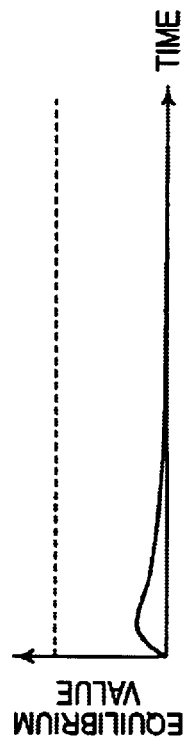
FIG. 3 (c) OUTPUT VALUE (COMPENSATING SIGNAL) OF PARALLEL COMPENSATING CIRCUIT 12
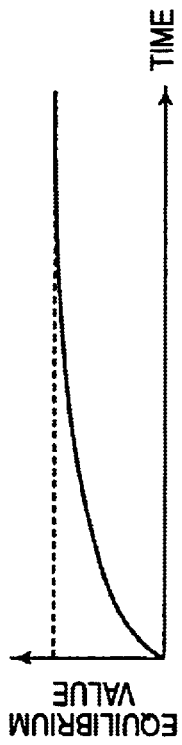
FIG. 3 (d) OUTPUT VALUE (DETECTION CORRECTION SIGNAL) OF ADDITION CIRCUIT 9

SEMICONDUCTOR LASER MODULE

TECHNICAL FIELD

The present invention relates to a semiconductor laser module having the function of controlling the temperature of a semiconductor laser.

BACKGROUND ART

As a semiconductor laser module having the function of controlling the temperature of a semiconductor laser, there is a known unit described in FLD5Fl4CN-E19 to E58 of FUJITSU SEMICONDUCTOR DEVICE DATA SHEET (DS02-12601-2). The automatic temperature control circuit described in the DATA SHEET has a Peltier element and a thermistor contained in a laser diode and an analog integrator and used for temperature control by proportion integration (P. I) control so that the actual temperature conforms to a set temperature.

Absolute precision and absolute stability of wavelength are required in the wavelength division multiplexing (WDM) communication system. Although distribution feedback (DFB) type semiconductor lasers are employed in such a WDM communication system, the temperature of the laser at the time of oscillation needs controlling precisely because the oscillation wavelength of the DFB type laser is easily affected by the temperature of the laser. The oscillation wavelength between adjoining channels tends to be set at 0.8 nm or less in the WDM communication system in recent years. The required wavelength precision of the laser for use in the system like this is 0.01 nm. In order to attain these requirements, it is needed to control the temperature of the laser at the time of oscillation within 0.1° C.

In the above-described prior-art automatic temperature control circuit, a steady state may be brought about in a state that the actual temperature deviates from a set temperature under the influence of thermal resistance and the like. In order to increase the precision of the temperature control by reducing the deviation between the actual temperature and the set temperature, the loop gain of a control system needs increasing. In the automatic temperature control circuit having a closed loop using the Peltier element, however, though it is possible to freely set a temperature in the case of PI control through digital processing, there occurs a great delay in transmission besides the primary delay between the Peltier element and the thermistor in the case of analog processing as the system is generally such that the response of the temperature is extremely slow in comparison with the response of the electronic circuit. For this reason, oscillation is likely to arise when the loop gain of the control system is increased too much. Therefore, the loop gain cannot be increased immoderately and this makes it difficult to raise the precision of the temperature control.

An object of the present invention is to provide a semiconductor laser module for making precise temperature control possible.

DISCLOSURE OF THE INVENTION

As a result of studies made earnestly on the foregoing problems, the present inventors have found that when input to an electronic refrigeration element is varied stepwise in the steady state in controlling the temperature of a semiconductor laser module using the electronic refrigeration element (a Peltier element) and a temperature detection element, a delay a rises from a point of time when the input thereto is varied until the output of the temperature detection element begins to actually vary and the delay greatly contributes to the oscillation as well as the primary delay. An object of the present invention is to cancel the delay.

More specifically, a semiconductor laser module according to the invention comprises: a semiconductor laser, laser temperature control means having an electronic refrigeration portion and a temperature detection portion for detecting the temperature of the electronic refrigeration portion and used for controlling the temperature of the semiconductor laser, and control signal generating means for inputting a detection signal of the temperature detection portion, generating a control signal for conforming the temperature of the electronic refrigeration portion with a set temperature and sending the control signal to the electric refrigeration portion, wherein the control signal generating means generates a compensating signal for compensating for a delay of temperature variation of the electronic refrigeration portion with respect to an input of the control signal to the electronic refrigeration portion, and generates a detection correction signal provided by correcting the detection signal by the compensating signal so as to generate the control signal according to the detection correction signal and a signal corresponding to the set temperature.

The provision of the control signal generating means makes it possible to obtain the detection correction signal which reduce the delay of actual temperature variation with respect to the set temperature variation as the detection signal is compensated by the compensating signal even though the actual temperature variation with respect to the set temperature variation is detected by the temperature detection portion with some delay caused by a delay in response between the electronic refrigeration portion and the temperature detection portion. The control signal is generated according to the detection correction signal and the signal corresponding to the set temperature and then inputted to the electric refrigeration portion. Therefore, application of energy more than necessary is prevented from being given to the electronic refrigeration portion immediately after the set temperature in the steady state is changed. As the loop gain of the control system can be increased thereby, the actual temperature of the electronic refrigeration portion is prevented from deviating from the set temperature in the steady state. Therefore, the electronic refrigeration portion can be put under precise temperature control.

Preferably, the control signal generating means has a filter circuit for inputting the control signal and generating the compensating signal, and an addition circuit for adding the detection signal and the compensating signal to generate the detection correction signal. Thus, means for generating the compensating signal and means for generating the detection correction signal are attainable with a simple circuit configuration. In the feedback loop in this case, the whole system is made controllable in an optimum mode by setting the values of resistors and capacitors constituting the filter circuit so that they have a filter time constant and a feedback quantity as desired.

In this case, preferably the control signal generating means has a first operational amplifier having one input portion to which the detection signal is input and the other input portion to which the control signal is input via a first capacitor, and a second capacitor and a resistor connected in parallel between the other input portion and an output portion of the first operational amplifier, and the first operational amplifier, the first capacitor, the second capacitor and the resistor make up the filter circuit and the addition circuit. In this case, the number of operational amplifiers used with the filter circuit and the addition circuit may be one, so that the circuit configuration of the module is simplified.

At this time, preferably the control signal generating means further has a second operational amplifier having an output portion connected to the other input portion of the first operational amplifier via the first capacitor, and a third capacitor connected between the output portion and one input portion of the second operational amplifier, and the third capacitor forms a part of the filter circuit. In this case, the number of capacitors serving the function as a low-pass filter becomes two, so that two small-sized capacitors can be appropriately combined to form a compensating signal having any desired time constant.

BRIEF DESCRIPTION OF THE DRAWINGS

FIG. 3 is operation waveform charts of the semiconductor laser module shown in FIG. 1; (a) is an operation waveform chart of set temperature; (b) is an operation waveform chart of the output value of a bias circuit; (c) is an operation waveform chart of the output value of a parallel compensating circuit; and (d) is an operation waveform chart of the output value of an addition circuit.

Figure 1:
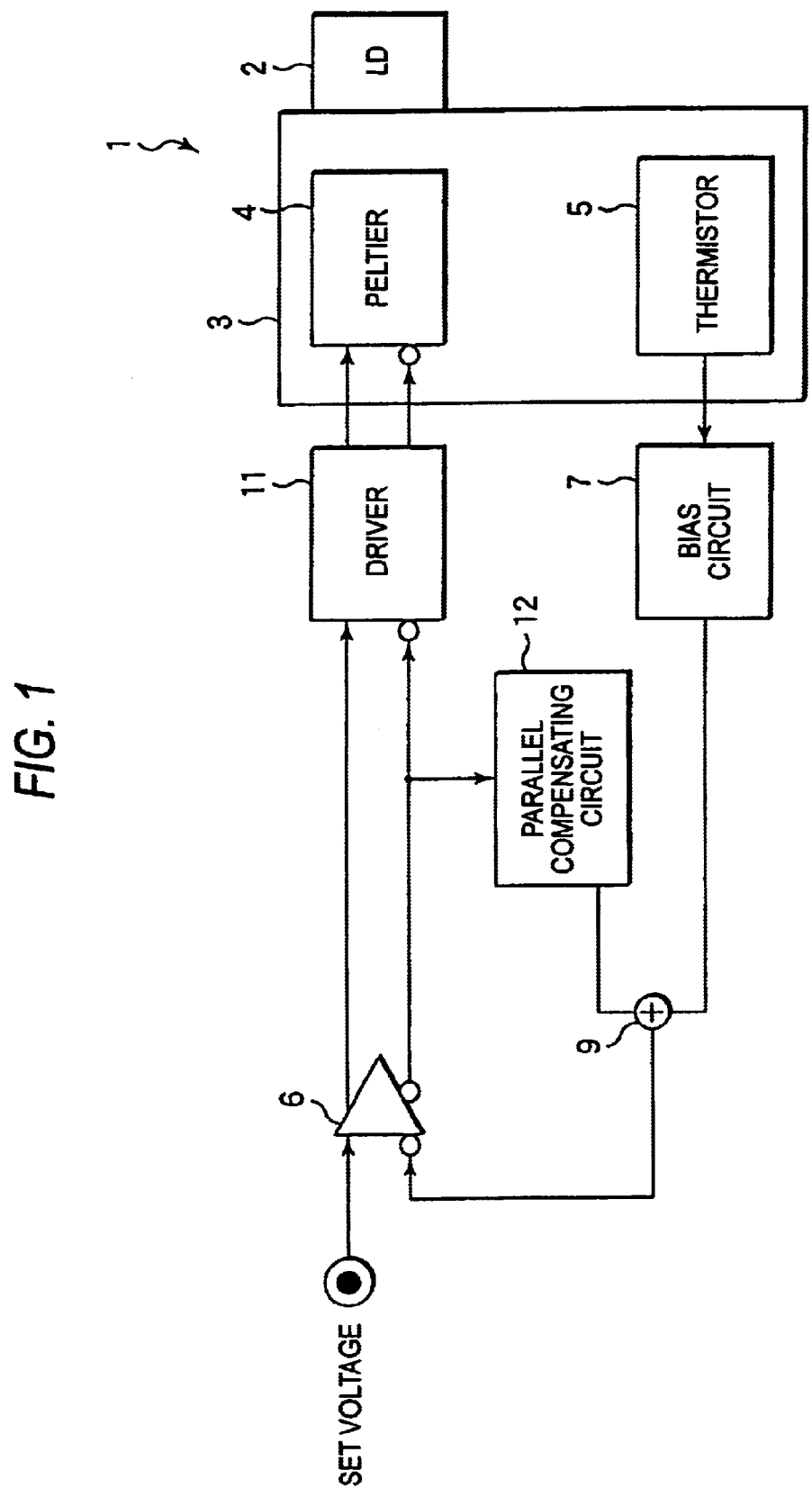
FIG. 1 is a configuration diagram to show a first embodiment of a semiconductor laser module according to the invention.

Reference numerals in the figures areas follows: Numeral 1 denotes a semiconductor laser module, numeral 2 denotes a semiconductor laser, numeral 3 denotes a laser temperature control element portion (laser temperature control means), numeral 4 denotes a Peltier element (electric refrigeration portion), numeral 5 denotes a thermistor (temperature detection portion), numeral 6 denotes a differential amplification circuit, numeral 7 denotes a bias circuit, numeral 9 denotes an addition circuit, numeral 12 denotes a parallel compensating circuit, numeral 21 denotes a high-pass filter circuit portion (filter circuit), numeral 22 denotes a low-pass filter circuit portion (filter circuit), numeral 46 denotes an operational amplifier (second operational amplifier), numeral 70 denotes a semiconductor laser module, numeral 71 denotes a differential amplification circuit, numeral 72 denotes a capacitor (third capacitor), numeral 73 denotes an operational amplifier (first operational amplifier), numeral 74 denotes a capacitor (first capacitor), numeral 76 denotes a resistor, and numeral 77 denotes a capacitor (second capacitor).

BEST MODE FOR CARRYING OUT THE INVENTION

A description of a semiconductor laser module as the preferred embodiments of the present invention will now be given by reference to the drawings.

FIG. 1 is a configuration diagram to show a first embodiment of a semiconductor laser module according to the invention. As shown in the figure, a semiconductor laser module 1 according to this embodiment is provided with a semiconductor laser (laser diode) 2 and a laser temperature control element portion 3 for controlling the temperature of the semiconductor laser 2. The laser temperature control element portion 3 has a Peltier element 4 as an electronic refrigeration element and a thermistor 5 as a temperature detection element for detecting the surface temperature of the Peltier element 4. In this case, the semiconductor laser 2 and the laser temperature control element portion 3 are in the form of, for example, one packaged integrated circuit.

The semiconductor laser module 1 has a differential amplification circuit 6 and a set signal (voltage) corresponding to a set temperature (target temperature) of the surface of the Peltier element 4 is applied to the non-inverting-(+)-side input portion of the differential amplification circuit 6. The thermistor 5 is connected to the inverting-(−)-side input portion of the differential amplification circuit 6 via an addition circuit 9 and a bias circuit 7. The non-inverting-side output portion and the inverting-side output portions of the differential amplification circuit 6 are connected via a driver 11 to the two metal electrodes (not shown) of the Peltier element 4. The differential amplification circuit 6 like this compares the input voltage of non-inverting-side input portion with the input voltage of inverting-side input portion and amplifies a signal corresponding to the difference between the input voltages with a predetermined amplifying degree (gain) to generate the control signal (voltage). Then the output voltage of the differential amplification circuit 6 is converted by the driver 11 into a current signal and introduced into the Peltier element 4.

The Peltier element 4, the thermistor 5, the bias circuit 7, the addition circuit 9, the differential amplification circuit 6 and the driver 11 constitute a feedback control system as one closed loop in order to control the temperature such that the surface temperature of the Peltier element 4 conforms to the set temperature. In this case, the surface temperature of the Peltier element 4 lowers as the current value input to the Peltier element 4 increases, whereas the surface temperature of the Peltier element 4 rises as the current value input to the Peltier element 4 decreases.

A parallel compensating circuit 12 branches and is connected to the inverting-side output portion of the differential amplification circuit 6. The parallel compensating circuit 12 generates a compensating signal for compensating for a delay of temperature variation of the Peltier element 4 with respect to input of a current signal to the Peltier element 4. The compensating signal is a signal with direct current (DC) component cut (see FIG. 3(c)). The output signal of the parallel compensating circuit 12 is input to the addition circuit 9, forming a local loop. The addition circuit 9 adds the output signal of the bias circuit 7 corresponding to the detection signal of the thermistor 5 and the output signal of the parallel compensating circuit 12 to generate a detection correction signal (see FIG. 3(d)).

Here, the differential amplification circuit 6, the bias circuit 7, the parallel compensating circuit 12, and the addition circuit 9 make up control signal generating means for generating a control signal supplied through the driver 11 to the Peltier element 4.

Figure 2:
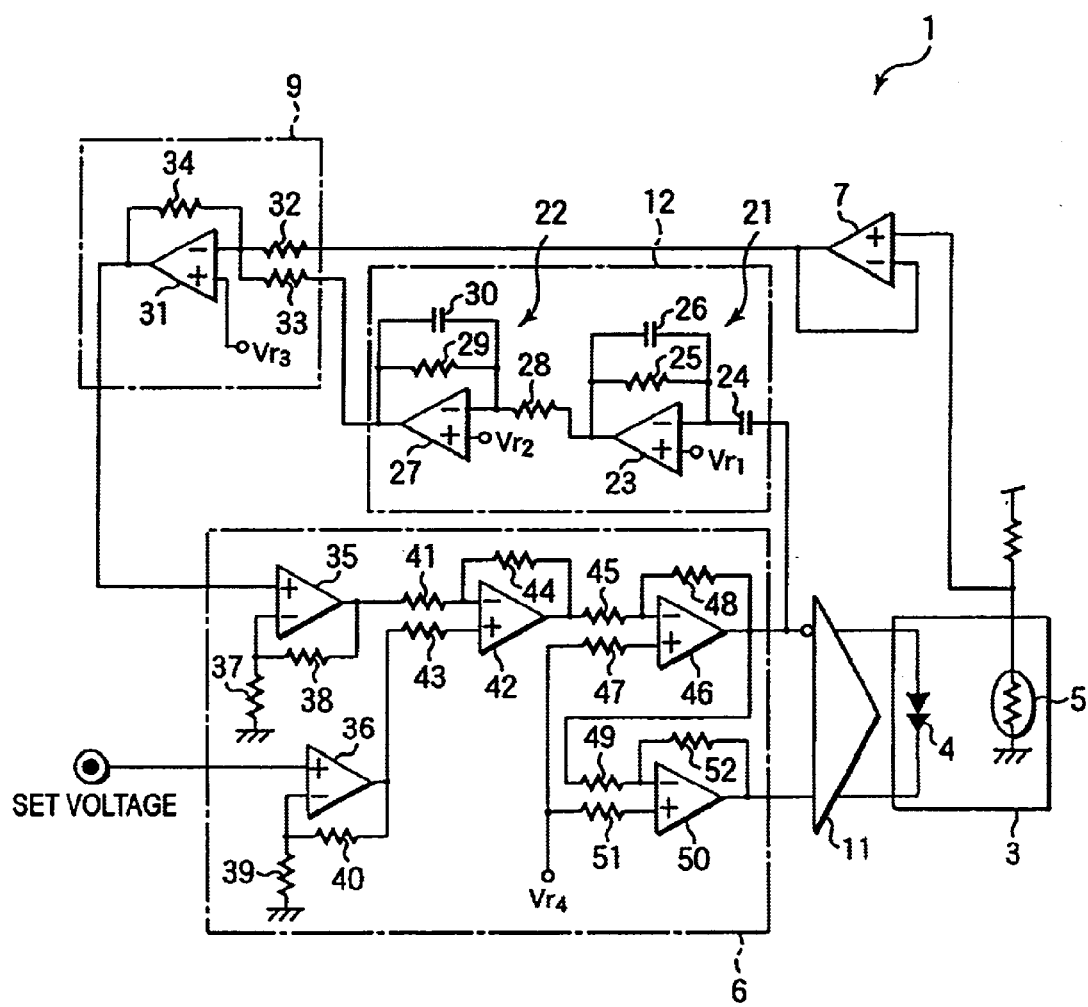
FIG. 2 is a diagram to show a specific circuit configuration of the semiconductor laser module shown in FIG. 1.

FIG. 2 shows a specific circuit configuration of the semiconductor laser module 1 described above. In the figure, the parallel compensating circuit 12 is provided with a high-pass filter (HPF) circuit portion 21 and a low-pass filter (LPF) circuit portion 22.

The HPF circuit portion 21 has an operational amplifier 23, and a reference voltage $V_{r1}$ is input to an in-phase input portion of the operational amplifier 23. A negative-phase input portion of the operational amplifier 23 is connected to the inverting-side output portion of the differential amplification circuit 6 via a capacitor 24. The negative-phase input portion and output portion of the operational amplifier 23 are connected via a resistor 25, and a capacitor 26 is connected in parallel to the resistor 25.

The LPF circuit portion 22 has an operational amplifier 27, and a reference voltage $V_{r2}$ is input to an in-phase input portion of the operational amplifier 27. A negative-phase input portion of the operational amplifier 27 is connected to the output portion of the operational amplifier 23 via a resistor 28. The negative-phase input portion and output portion of the operational amplifier 27 are connected via a resistor 29, and a capacitor 30 is connected in parallel to the resistor 29.

The addition circuit 9 has an operational amplifier 31, and a reference voltage $V_{r3}$ is input to an in-phase input portion of the operational amplifier 31. A negative-phase input portion of the operational amplifier 31 is connected via resistors 32 and 33 to the output portion of the operational amplifier forming the bias circuit 7 and the output portion of the operational amplifier 27. The negative-phase input portion and output portion of the operational amplifier 31 are connected via a resistor 34.

The differential amplification circuit 6 has operational amplifiers 35 and 36. An in-phase input portion of the operational amplifier 35 is connected to the output portion of the operational amplifier 31, and a negative-phase input portion of the operational amplifier 35 is grounded via a resistor 37. The negative-phase input portion and output portion of the operational amplifier 35 are connected via a resistor 38. A set signal is input to an in-phase input portion of the operational amplifier 36, and a negative-phase input portion of the operational amplifier 36 is grounded via a resistor 39. The negative-phase input portion and output portion of the operational amplifier 36 are connected via a resistor 40. The output portion of the operational amplifier 35 is connected to a negative-phase input portion of an operational amplifier 42 via a resistor 41, and the output portion of the operational amplifier 36 is connected to an in-phase input portion of the operational amplifier 42 via a resistor 43. The negative-phase input portion and output portion of the operational amplifier 42 are connected via a resistor 44. The output portion of the operational amplifier 42 is connected to a negative-phase input portion of an operational amplifier 46 via a resistor 45, and a reference voltage $V_{r4}$ is input to an in-phase input portion of the operational amplifier 46 via a resistor 47. The negative-phase input portion and output portion of the operational amplifier 46 are connected via a resistor 48. The output portion of the operational amplifier 46 is connected to a negative-phase input portion of an operational amplifier 50 via a resistor 49, and the reference voltage $V_{r4}$ is input to an in-phase input portion of the operational amplifier 50 via a resistor 51. The negative-phase input portion and output portion of the operational amplifier 50 are connected via a resistor 52. The output portions of the operational amplifiers 46 and 50 are connected to the driver 11.

In the semiconductor laser module 1 thus arranged, when the set temperature $T_o$ of the surface of the Peltier element 4 is raised stepwise in a steady state (see FIG. 3(a)), the actual surface temperature of the Peltier element 4 is controlled to go closer to the set temperature $T_o$.

The closed loop in connection with the above-described temperature control is characterized in that the response of the temperature is extremely slower than the response of the electronic circuit; that is, the system has an extremely large time constant within the closed loop (between the Peltier element 4 and the thermistor 5). Consequently, even though the current value supplied to the Peltier element 4 is varied for a short period of time, the surface temperature of the Peltier element 4 is unable to follow the variation in temperature immediately but varied with a predetermined time delay and this is detected by the thermistor 5. Therefore, the output signal of the bias circuit 7 corresponding to the detection signal of the thermistor 5 becomes a signal as shown in FIG. 3(b).

At this time, the output signal from the inverting-side output portion of the differential amplification circuit 6 is sent to the parallel compensating circuit 12, which then generates a compensating signal for compensating for a delay of temperature variation of the Peltier element 4 with respect to input of a current signal to the Peltier element 4. The compensating signal is such a signal that as shown in FIG. 3(c) its level rises from a point of time that the set temperature $T_o$ of the Peltier element 4 has changed and then gradually falls after the predetermined time passes and that finally its DC component is reduced to zero. A time constant of the compensating signal can be adjusted appropriately by setting the values of resistor and capacitor of the parallel compensating circuit 12 as desired.

Such a compensating signal is sent to the addition circuit 9, which then adds the detection signal (output value of the bias circuit 7) and the compensating signal to generate a detection correction signal. The detection correction signal is as shown in FIG. 3(d) almost free from any delay with respect to the variation of the set temperature $T_o$; in other words, it is a signal that the primary delay is caused immediately after the set temperature $T_o$ is changed.

The detection correction signal is sent to the differential amplification circuit 6, and a control signal corresponding to the difference between the detection correction signal and the set signal corresponding to the set temperature $T_o$ is generated. This control signal is converted by the driver 11 to a current signal before being input to the Peltier element 4. Accordingly, the surface temperature of the Peltier element 4 converges to set temperature $T_o$.

Figure 4:
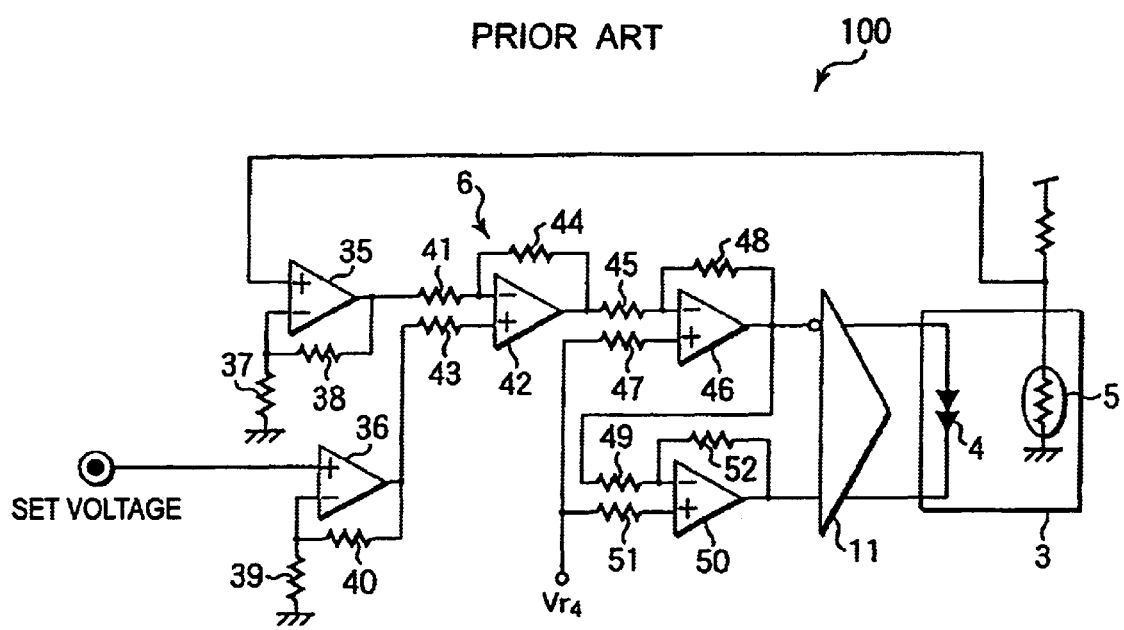
FIG. 4 is a diagram to show the circuit configuration of a general semiconductor laser module in a prior art.

Here, as a comparison example, FIG. 4 shows the circuit configuration of a general semiconductor laser module in a prior art. In the figure, a semiconductor laser module 100 differs from the semiconductor laser module 1 in that it does not have the bias circuit 7, the addition circuit 9, and the parallel compensating circuit 12 described above, namely, no local loop exists. In such a configuration, a detection signal of a thermistor 5 equivalent to the signal shown in FIG. 3(b) is input to an inverting-side input portion of a differential amplification circuit 6 (in-phase input portion of operational amplifier 35) as it is. A current signal responsive to the difference between the detection signal and the set signal corresponding to the set temperature $T_o$ is supplied to the Peltier element 4.

In this case, the current value applied to the Peltier element 4 is expressed by a portion $A_1$ with oblique lines surrounded with the set temperature $T_p$ and the detection signal T in FIG. 5(a). At this time, though the detection signal T rises after the passage of a predetermined time B from a point of time of the change of the set temperature $T_p$, the application of the current to the Peltier element 4 is continued even for the delayed period B. As the detection signal T remains unchanged during this period, a relatively large current value is to be applied to the Peltier element 4.

The fact that great energy of the current signal applied to the Peltier element 4 significantly contributes to an excessive fall (undershoot) or an excessive rise (overshoot) in the temperature control of the Peltier element 4 has been ascertained by experiment.

That is, even though the current value supplied to the Peltier element 4 is reduced when the surface temperature of the Peltier element 4 reaches the set temperature $T_o$, the surface temperature of the Peltier element 4 is unable to follow the variation in temperature immediately but begins to follow the variation in temperature after an undershoot or an overshoot. Then, the undershoot or overshoot is repeated. In case where the setting of the time constant of an electronic circuit is appropriate then, the undershoot or the overshoot is gradually decreased and the surface temperature of the Peltier element 4 is going closer to the set temperature $T_o$ and in case where the setting of the time constant is inappropriate, an oscillation phenomenon occurs.

In order to suppress such oscillation by decreasing the undershoot and overshoot of the temperature, it is only needed to reduce the gain of the differential amplification circuit 6, for example. However, the reduction of the gain of the differential amplification circuit 6 is not preferred because the deviation of the actual temperature from the set temperature $T_o$ may induce the steady state with the establishment of the following equation (A).

$$T_M = T_o - \alpha q/A \quad (A)$$

(where $T_M$: equilibrium temperature, $T_o$: set temperature, α: functions of thermal capacity and thermal resistance, q: outflow thermal quantity per second, and A: gain of differential amplification circuit)

Figure 5:
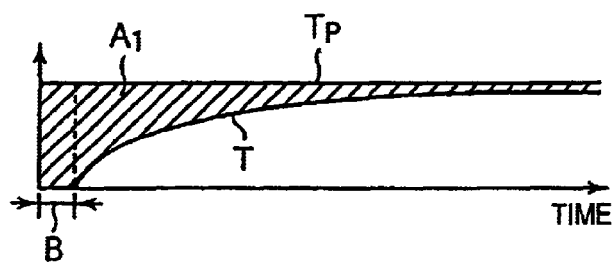
FIG. 5 shows comparison of current signals applied to Peltier elements; (a) is a drawing to show the current signal of the semiconductor laser module shown in FIG. 4 and (b) is a drawing to show the current signal of the semiconductor laser module shown in FIG. 1.
Figure 5:
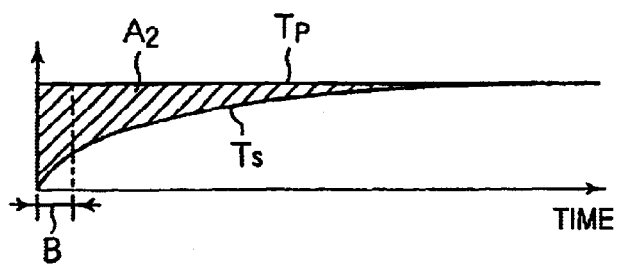

In contrast, in the embodiment, since the parallel compensating circuit 12 and the addition circuit 9 are provided and the output signal of the parallel compensating circuit 12 is fed back into the input of the differential amplification circuit 6 via the addition circuit 9, the current value applied to the Peltier element 4 at this time is expressed by a portion A with oblique lines surrounded with the set temperature $T_p$ and a detection correction signal $T_S$ in FIG. 5(*b*). As the detection correction signal $T_S$ is set so that the timing of output variation with respect to the variation of set temperature $T_p$ is accelerated as described above, the current value (energy) applied to the Peltier element 4 during the delayed period B of variation of the detection signal with respect to the variation of the set temperature $T_p$ is decreased in comparison with the case of FIG. 5(*a*).

In feedback control of the surface temperature of the Peltier element 4, since the gain of the differential amplification circuit 6 can thus be increased without occurrence of an oscillation phenomenon, the surface temperature of the Peltier element 4 is prevented from being in the steady state while the surface temperature thereof is deviated from the set temperature. The surface temperature of the Peltier element 4 can therefore be controlled with high precision and stability. Consequently, wavelength precision necessary for the wavelength division multiplexing (WDM) communication system can be secured.

In the case where the delay time B of the detection signal of the thermistor 5 is 100 mS, it has been clarified by experiment that the system as a whole is made controllable quickly and stably by setting the values of the resistors and the capacitors constituting the parallel compensating circuit 12 so that the time constant of the parallel compensating circuit 12 ranges from 200 to 300 ms and the feedback quantity in a feedback loop ranges approximately from 20 to 30%.

Moreover, as it is possible to compensate for a delay in temperature variation in the Peltier element 4 with respect to the input of current signal to the Peltier element 4 by means of a simple circuit comprising the parallel compensating circuit 12 and the addition circuit 9, this arrangement is advantageous in view of cost reduction.

Figure 6:
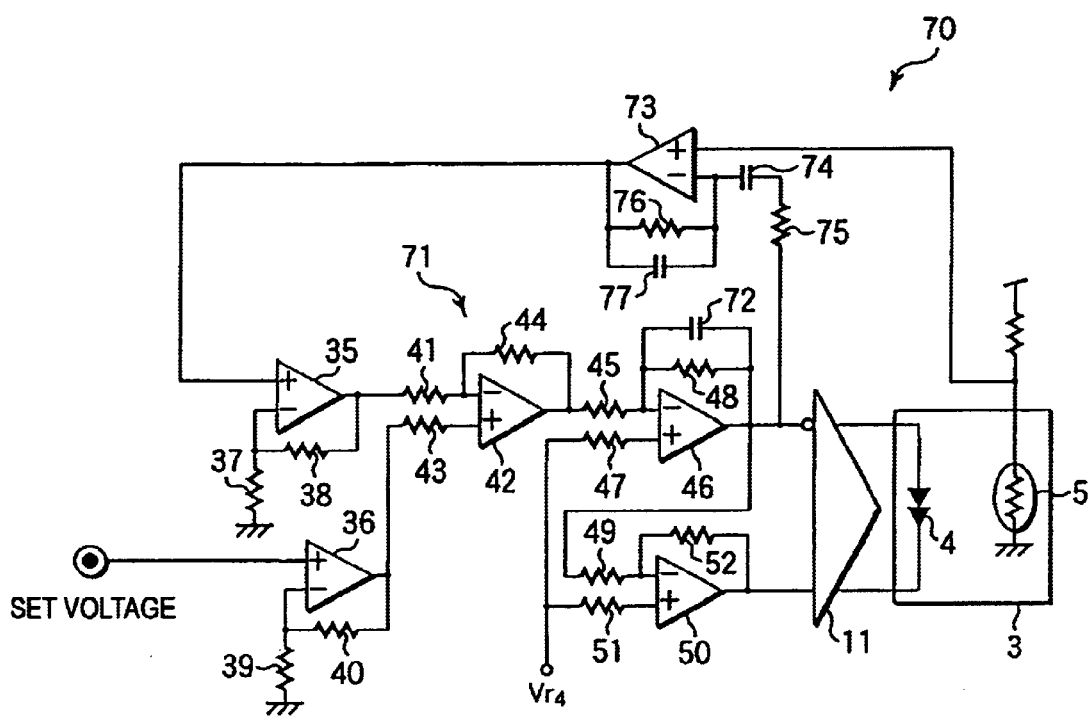
FIG. 6 is a diagram to show the circuit configuration of a second embodiment of a semiconductor laser module according to the invention.

FIG. 6 is a circuit configuration diagram to show a second embodiment of a semiconductor laser module according to the invention. Parts identical with those in the first embodiment are denoted by the same reference numerals in the figure and will not be discussed again.

In the figure, a semiconductor laser module 70 of the embodiment has a differential amplification circuit 71 comprising a capacitor 72 connected in parallel to the resistor 48 in the differential amplification circuit 6 in the first embodiment.

The semiconductor laser module 70 has an operational amplifier 73. An in-phase input portion of the operational amplifier 73 is connected to a thermistor 5, and a negative-phase input portion of the operational amplifier 73 is connected to an output portion of an operational amplifier 46 of the differential amplification circuit 71 via a capacitor 74 and a resistor 75. The negative-phase input portion and output portion of the operational amplifier 73 are connected via a resistor 76, and a capacitor 77 is connected in parallel to the resistor 76. The output portion of the operational amplifier 73 is connected to an in-phase input portion of an operational amplifier 35 of the differential amplification circuit 71. In such a circuit configuration, the gain of the operational amplifier 73 can be changed appropriately by setting the values of the resistors 75 and 76 as desired.

In the semiconductor laser module 70, the operational amplifier 73 has a function as the addition circuit 9 in the first embodiment. That is, a detection signal of the thermistor 5 is input to the in-phase input portion of the operational amplifier 73, and a signal output from an inverting-side output portion of the differential amplification circuit 71 (the output portion of the operational amplifier 46) is input to the negative-phase input portion of the operational amplifier 73 and consequently the detection signal of the thermistor 5 and the output signal of the operational amplifier 46 are added. The operational amplifier 73, the resistor 76, and the capacitors 72, 74, and 77 have a function as the parallel compensating circuit 12 in the first embodiment. Specifically, the capacitor 74 serves as an HPF and the capacitors 72 and 77 serve as an LPF. Therefore, the semiconductor laser module 70 operates in a similar manner to that of the semiconductor laser module 1 of the first embodiment.

In the described embodiment, the number of the operational amplifiers used is drastically decreased as compared with the first embodiment, so that the manufacturing costs can be reduced. Since the circuit configuration of the semiconductor laser module is downsized, the module itself can be miniaturized. Small-sized capacitors can be used in combination as the capacitors 72 and 77 serving as the LPF to provide a compensating signal having an optimum time constant. Therefore, the module itself can also be miniaturized in this point. Further, the capacitor 72 is connected to the operational amplifier 48 at the output stage of the differential amplification circuit 71, so that it is made possible to suppress oscillation in a high-frequency band.

The invention is not limited to the above-described embodiments thereof. Although according to this embodiment of the invention, the compensating signal with the DC component being cut is formed with a circuit inclusive of a simple high-pass filter, for example, it may otherwise be formed with a one-shot multivibrator which generates pulse signal with predetermined time by the predetermined timing signal and the like.

Although according to this embodiment of the invention, the signal with the DC component being cut is finally generated as the compensating signal, an arrangement for generating a compensating signal having such a DC component may be adopted. This arrangement is satisfactorily usable by shifting the gain of the differential amplification circuit and the set temperature so that temperature control is adequately less affected by the DC component, for example. In case where the compensating signal has the DC component, the above-described equation (A) is expressed by the following equation (B). In this case, however, a DC level $B_0$ may be set so as to cancel the deviation of an equilibrium temperature $T_H$ from the set temperature $T_o$ and a higher gain of the differential amplification circuit becomes unnecessary at this time.

$$T_H = T_o - \alpha q(1 + B_0 \times A)/A \qquad (B)$$

(where $T_H$: equilibrium temperature, $T_o$: set temperature, $\alpha$: functions of thermal capacity and thermal resistance, q: outflow thermal quantity per second, $B_0$: DC level, and A: gain of differential amplification circuit).

While the invention has been particularly shown and described with reference to specific embodiments thereof, it will be understood by those skilled in the art that various changes and corrections can be made therein without departing from the spirit and scope of the invention.

The application is based on Japanese patent application (2000-371618) filed on Dec. 6, 2000 and Japanese patent application (2001-368927) filed on 3 Dec. 2001, and the contents are taken therein as reference.

INDUSTRIAL APPLICABILITY

According to the invention, the compensating signal for compensating for a delay in temperature variation in the electronic refrigeration portion with respect to the input of control signal to the electronic refrigeration portion is generated, the detection correction signal provided by correcting the detection signal by the compensating signal is generated, and the control signal is generated according to the detection correction signal and the signal corresponding to the set temperature, whereby the precision of the temperature control in the electronic refrigeration portion can be improved. As the temperature of the semiconductor laser at the time of oscillation is controlled with high precision, wavelength precision necessary for the wavelength division multiplexing (WDM) communication system can thus be secured satisfactorily.

What is claimed is:

1. A semiconductor laser module comprising:

a semiconductor laser;

a laser temperature control means having an electronic refrigeration portion and a temperature detection portion for detecting a temperature of the electronic refrigeration portion and outputting a detection signal, said laser temperature control means performing temperature control of said semiconductor laser while compensating for a delay in temperature variation by the electronic refrigeration portion with respect to input of a control signal to the electronic refrigeration portion; and a control signal generating means for inputting the detection signal output from the temperature detection portion, generating the control signal for setting the temperature of the electronic refrigeration portion to a set temperature, and sending the control signal to the electronic refrigeration portion, wherein said control signal generating means includes a means for generating a compensating signal for compensating for delay by the electronic refrigeration portion in varying temperature with respect to the control signal input to the electronic refrigeration portion, a means for generating a detection correction signal based on the detection signal and the compensating signal, and a means for generating the control signal based on the detection correction signal and a signal corresponding to the set temperature.

2. The semiconductor laser module as claimed in claim 1 wherein said control signal generating means has a filter circuit for inputting the control signal and generating the compensating signal and an addition circuit for adding the detection signal and the compensating signal to generate the detection correction signal.

3. A semiconductor laser module comprising:

a semiconductor laser;

a laser temperature control means having an electronic refrigeration portion and a temperature detection portion for detecting a temperature of the electronic refrigeration portion, said laser temperature control means for performing temperature control of said semiconductor laser;

and control signal generating means for inputting a detection signal of the temperature detection portion, generating a control signal for conforming the temperature of the electronic refrigeration portion with a set temperature, and sending the control signal to the electronic refrigeration portion, wherein said control signal generating means is means for generating a compensating signal for compensating for a delay of a temperature variation of the electronic refrigeration portion with respect to an input of the control signal to the electronic refrigeration portion, generating a detection correction signal provided by correcting the detection signal by the compensating signal, and generating the control signal based on the detection correction signal and a signal corresponding to the set temperature, wherein said control signal generating means has a filter circuit for inputting the control signal and generating the compensating signal and an addition circuit for adding the detection signal and the compensating signal to generate the detection correction signal wherein said control signal generating means has a first operational amplifier having one input portion to which the detection signal is input and an other input portion to which the control signal is input via a first capacitor, and a second capacitor and a resistor connected in parallel between the other input portion and an output portion of the first operational amplifier and wherein the first operational amplifier, the first capacitor, the second capacitor, and the resistor make up the filter circuit and the addition circuit.

4. The semiconductor laser module as claimed in claim 3 wherein said control signal generating means further has a second operational amplifier having an output portion connected to the other input portion of the first operational amplifier via the first capacitor, and a third capacitor connected between the output portion and one input portion of the second operational amplifier and wherein the third capacitor forms a part of the filter circuit.

* * * * *